(12) United States Patent
Low et al.

(10) Patent No.: US 8,643,189 B1
(45) Date of Patent: Feb. 4, 2014

(54) PACKAGED SEMICONDUCTOR DIE WITH POWER RAIL PADS

(75) Inventors: Boon Yew Low, Petaling Jaya (MY); Navas Khan Oratti Kalandar, Subang Jaya (MY); Lan Chu Tan, Singapore (SG)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/550,627

(22) Filed: Jul. 17, 2012

(51) Int. Cl.
*H01L 23/12* (2006.01)
*H01L 23/58* (2006.01)
*H01L 23/50* (2006.01)
*H01L 23/34* (2006.01)

(52) U.S. Cl.
USPC ............ 257/773; 257/E31.111; 257/E23.142; 257/774; 257/784; 257/786; 257/690; 257/691; 257/692; 257/693; 257/696; 257/698; 257/203; 257/204; 257/782; 257/776

(58) Field of Classification Search
USPC ......... 257/773, 774, 784, 786, 690–693, 696, 257/698, 666, 676, 202–24, 208, 211, 776, 257/782, 790–793, E31.111, E23.142
See application file for complete search history.

(56) References Cited

U.S. PATENT DOCUMENTS

| | | | | |
|---|---|---|---|---|
| 5,049,979 A | * | 9/1991 | Hashemi et al. | 257/723 |
| 5,286,656 A | * | 2/1994 | Keown et al. | 438/18 |
| 5,508,556 A | | 4/1996 | Lin | |
| 5,528,083 A | * | 6/1996 | Malladi et al. | 257/786 |
| 5,641,978 A | * | 6/1997 | Jassowski | 257/203 |
| 5,789,797 A | | 8/1998 | Ikuta | |
| 5,903,050 A | * | 5/1999 | Thurairajaratnam et al. | 257/695 |
| 6,420,785 B2 | | 7/2002 | Song | |
| 6,858,945 B2 | * | 2/2005 | Rakshani | 257/786 |
| 6,912,171 B2 | | 6/2005 | Theel | |
| 7,190,062 B1 | | 3/2007 | Sheridan | |
| 7,528,484 B2 | * | 5/2009 | Rakshani | 257/724 |
| 7,872,335 B2 | | 1/2011 | Khan | |
| 7,880,310 B2 | * | 2/2011 | Mathew | 257/777 |
| 7,898,080 B2 | * | 3/2011 | Otremba | 257/732 |
| 8,168,970 B2 | * | 5/2012 | Whetsel et al. | 257/48 |
| 2002/0063251 A1 | * | 5/2002 | Sugiura et al. | 257/48 |
| 2004/0268281 A1 | * | 12/2004 | Dotson et al. | 716/10 |
| 2005/0024800 A1 | * | 2/2005 | Zecri et al. | 361/56 |
| 2006/0001146 A1 | * | 1/2006 | Passe et al. | 257/690 |
| 2009/0085201 A1 | * | 4/2009 | Mathew | 257/734 |
| 2010/0171543 A1 | * | 7/2010 | Korec et al. | 327/436 |
| 2010/0270663 A1 | | 10/2010 | Johnston | |
| 2012/0286409 A1 | * | 11/2012 | Shah et al. | 257/676 |

* cited by examiner

*Primary Examiner* — A O Williams
(74) *Attorney, Agent, or Firm* — Charles Bergere

(57) ABSTRACT

A packaged semiconductor die has a die support mounting surface mounted to a die support having external connectors. A die connection pad surface opposite to die supporting mount surface has associated die connection pads that are circuit nodes of the semiconductor die. The die connection pad surface also has a power rail pad. The power rail pad has a surface area larger than surface areas of the die connection pads. Bond wires electrically couple the power rail pad to two or more of the die connection pads.

20 Claims, 7 Drawing Sheets

PACKAGED SEMICONDUCTOR DIE WITH POWER RAIL PADS

BACKGROUND OF THE INVENTION

The present invention relates to semiconductor integrated circuits and packaging of semiconductor integrated circuits and, more particularly, to a packaged semiconductor die that has many wire bonded connections with a large proportion being power rail wire bonds for supplying a positive supply rail and a ground supply rail to the die.

Semiconductor die packages are typically formed with a semiconductor die mounted on a semiconductor die support such a die pad or flag of a lead frame, or a substrate. External connectors on either the substrate or leads of the lead-frame are wire bonded to die connection pads on the die to provide a means of easily electrically connecting the die to circuit boards and the like. After the connectors and pads are wire bonded, the semiconductor die and bond wires are encapsulated (packaged) in a compound such as a plastics material leaving external pads of the substrate or sections of the leads exposed. The external connectors or exposed leads allow for external electrical connection of the die to a circuit board.

There is always a desire for more or additional external connections to the die and thus the number of external connectors (pin count) is often increased to accommodate increased functionality and power supply rail requirements of the semiconductor die. The external connectors are needed to connect to power rail pads, ground rail pads and data input and output pads of the die. An increase in the number of external connectors typically results in an increased size of the semiconductor die package (footprint), and the requirement of additional wire bonds. The number of power rail wire bonds required for the power supply rail (the positive supply rail and ground rail) to the power rail pads may account for a large proportion of the wire bonds. These power rail wire bonds, which can be as high as 50% of all the wire bonds, may cause stray capacitances with data wire bonds that couple the data input and output pads to the external connectors. Also, the additional lengths of the bond wires may add to stray capacitance effects and also increase the possibility of noise induction. Therefore, it would be desirable to be able to accommodate additional external connections without increasing the chance of noise inductance, cross-coupling, etc.

BRIEF DESCRIPTION OF THE DRAWINGS

The invention, together with objects and advantages thereof, may best be understood by reference to the following description of preferred embodiments together with the accompanying drawings in which.

DETAILED DESCRIPTION OF PREFERRED EMBODIMENTS

Figure 1:
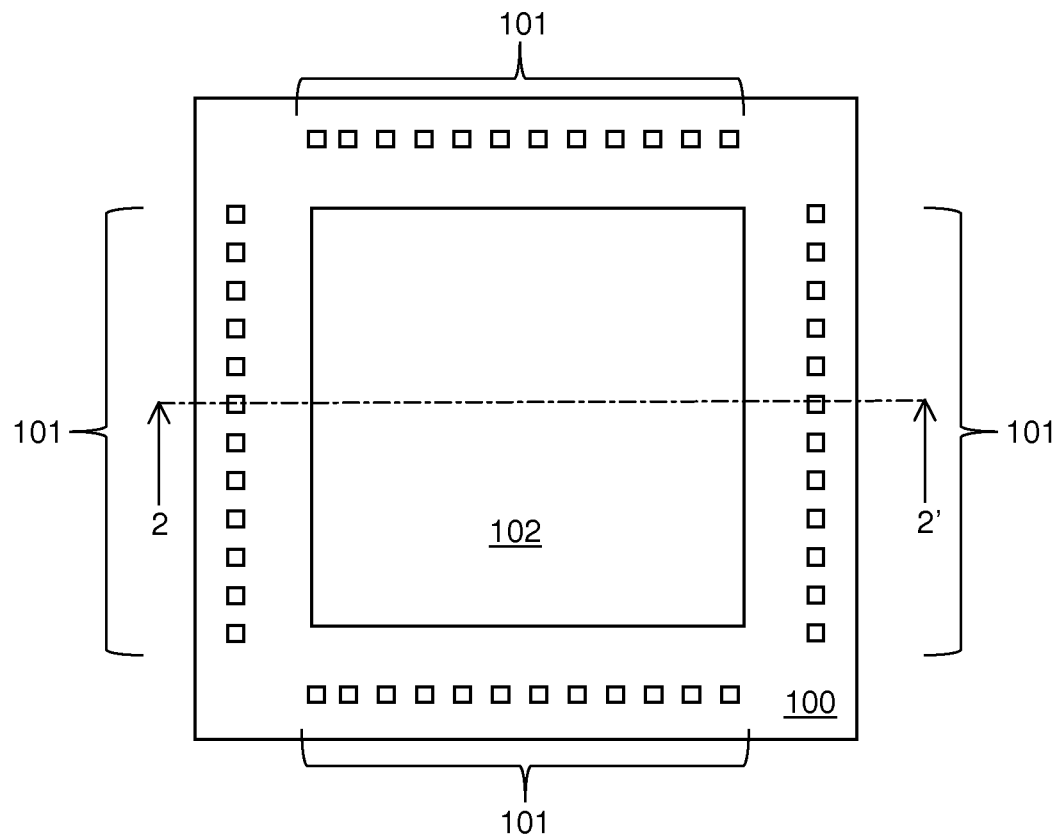
FIG. 1 is a plan view of a semiconductor die support in accordance with a preferred embodiment of the present invention.

The detailed description set forth below in connection with the appended drawings is intended as a description of presently preferred embodiments of the invention, and is not intended to represent the only forms in which the present invention may be practiced. It is to be understood that the same or equivalent functions may be accomplished by different embodiments that are intended to be encompassed within the spirit and scope of the invention. In the drawings, like numerals are used to indicate like elements throughout. Furthermore, terms "comprises," "comprising," or any other variation thereof, are intended to cover a non-exclusive inclusion, such that system, circuit, device components and method steps that comprises a list of elements or steps does not include only those elements but may include other elements or steps not expressly listed or inherent to such system, circuit, device components or steps. An element or step proceeded by "comprises . . . a" does not, without more constraints, preclude the existence of additional identical elements or steps that comprises the element or step.

In one embodiment of the present invention, a semiconductor die package comprises a semiconductor die support having external connectors. A semiconductor die is mounted to the die support, the semiconductor die having a die support mounting surface attached to the die support and an opposite die connection pad surface with associated die connection pads. The die connection pads are circuit nodes of the semiconductor die. At least one power rail pad is located on the die connection pad surface. The power rail pad has a surface area larger than surface areas of the die connection pads. Bond wires electrically couple the power rail pad to at least two of the die connection pads.

In another embodiment of the present invention, a semiconductor die comprises a die support mounting surface and an opposite die connection pad surface with associated die connection pads. The die connection pads are circuit nodes of the semiconductor die. At least one power rail pad is located on the die connection pad surface. The power rail pad has a surface area larger than surface areas of the die connection pads. The die connection pads are integral with the semiconductor die and the power rail pad is a non-circuit node of the semiconductor die.

In yet another embodiment of the present invention there, a method for assembling a semiconductor die package is provided. The method includes providing a semiconductor die support with external connectors and providing a semiconductor die with a die support mounting surface and an opposite die connection pad surface with associated die connection pads. The connection pads are circuit nodes of the semiconductor die. At least one power rail pad is located on the die connection pad surface and the power rail pad has a surface area larger than surface areas of the die connection pads. The method includes mounting the semiconductor die to the die support at the die support mounting surface and electrically coupling the power rail pad to at least two of the die connection pads with bond wires. The power rail pad also is electrically coupled to at least one of the external connectors by power rail wire bonds. There is further performed electrically coupling of some of the die connection pads to the external connectors by data wire bonds. The method then performs encapsulating the semiconductor die, power rail wire bonds, die wire bonds and data wire bonds.

Referring to FIG. 1, a plan view of a semiconductor die support 100 in accordance with a preferred embodiment of the present invention is shown. The semiconductor die support 100 is a non-conductive substrate, typically made from the same materials as a printed circuit board. The semiconductor die support 100 has external connectors 101 and at a central region of the semiconductor die support 100 there is a die mount area for attaching a die with an epoxy or other form of adhesive 102.

Figure 2:
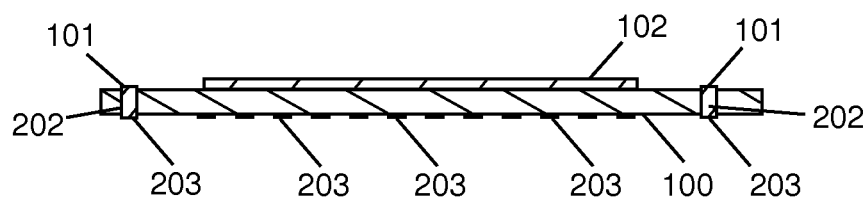
FIG. 2 is a cross-sectional view through 2-2' of the semiconductor die support of FIG. 1.

FIG. 2 is a cross-sectional view of the semiconductor die support 100. As shown, the external connectors 101 include electrically conductive vias 202 with external conductive surfaces 203 for electrical coupling to circuit board pads or the like. As will be apparent to a person skilled in the art, if required, the electrically conductive vias 202 may be coupled to balls of a ball grid array and thus the balls would form the external conductive surfaces 203.

Figure 3:
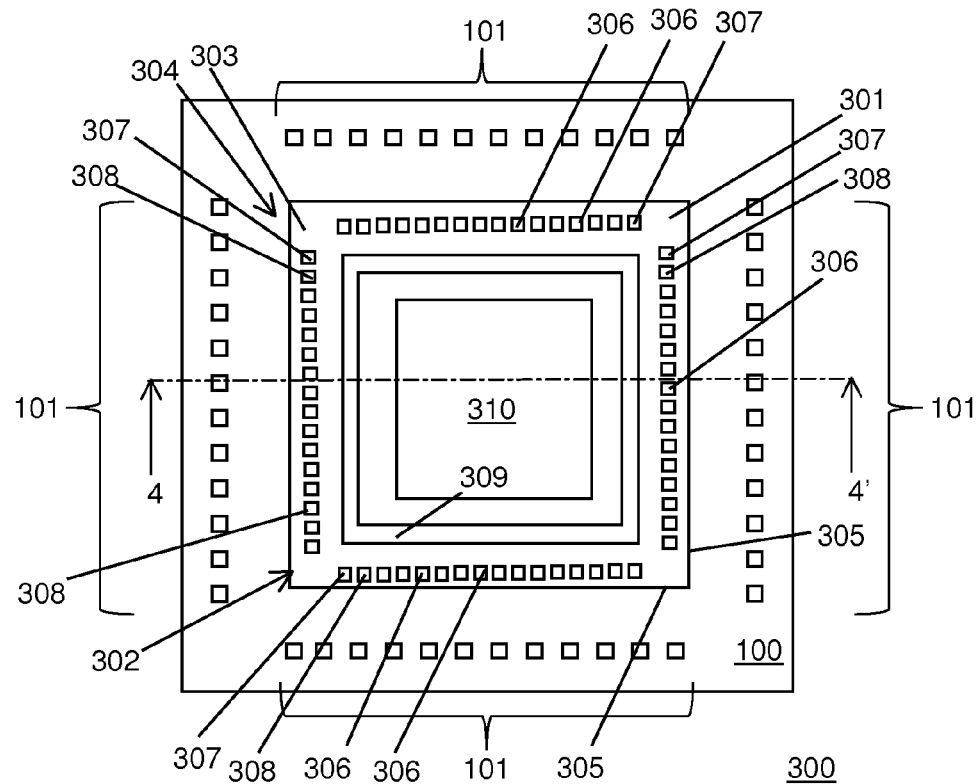
FIG. 3 is a plan view of partially assembled semiconductor die package including the semiconductor die support of FIG. 1 in accordance with a preferred embodiment of the present invention.

FIG. 3 is a plan view of a partially assembled semiconductor die package 300 including the semiconductor die support 100 in accordance with a preferred embodiment of the present invention. The partially assembled semiconductor die package 300 includes a semiconductor die 301 mounted to the die support 100. More specifically, the semiconductor die 301 is mounted to the die mount area by the adhesive 102.

The semiconductor die 301 has a die support mounting surface 302 attached to the die support 100, by the adhesive 102, and an opposite die connection pad surface 303 with associated die connection pads 304. The die connection pads 304 are circuit nodes of the semiconductor die 301 and as shown the die connection pads 304 are adjacent respective edges 305 of the semiconductor die 301.

The die connection pads 304 include data input and output pads 306 for the semiconductor die 301. The die connection pads 304 also include positive voltage supply rail die connection pads 307 and ground supply rail die connection pads 308 for supplying a power to the semiconductor die 301.

There are power rail pads on the die connection pad surface 303, the power rail pads are a first power rail pad 309 and a second power rail pad 310. As shown, the first power rail pad 309 and second power rail pad 310 have surface areas larger than the surface areas of the die connection pads 304. More specifically, each of the power rail pads 309, 310 have a surface area of at least two and preferably at least four times that of an average surface area of the die connection pads 304.

In most embodiments, the power rail pads 309, 310 have a surface area much greater than four times that of an average surface area of the die connection pads 104. Furthermore, one or both of the power rail pads 309, 310 can have a surface area of at least ten that of the average surface area of the die connection pads 304. However, in the embodiment illustrated, both of the power rail pads have a surface area of at least twenty times the average surface area of the die connection pads 304.

The power rail pads 309, 310 may be of numerous shapes and sizes and, as illustrated, in one embodiment the first power rail pad 309 is a frame that encloses the second power rail pad 310. The power rail pads 309, 310 may be thin sheets of metal (or metal alloy) such as copper, cut to shape and size and mounted on the die connection pad surface 303 by an epoxy or other form of adhesive.

Figure 4:
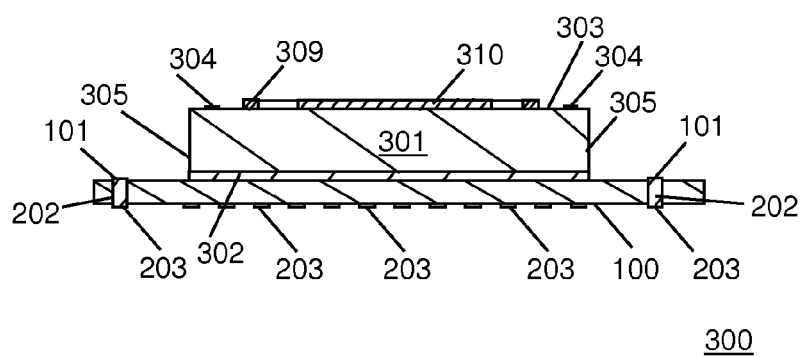
FIG. 4 is a cross-sectional view through 4-4' of the partially assembled semiconductor die package of FIG. 3.

FIG. 4 is a cross-sectional view of the partially assembled semiconductor die package 300. As shown, the power rail pads 309, 310 protrude higher above the die connection pad surface 303 than the die connection pads 303. However, this may not always be the case and depends on the thickness of the sheet metal or duration (and type) of depositing process used to form the power rail pads 309, 310. Furthermore, although desirable, the thickness of the power rail pads 309, 310 does not necessarily have to be the same.

From the above it will be apparent to a person skilled in the art that, unlike the die connection pads 303, the power rail pads 309, 310 are non-circuit nodes of the semiconductor die 301. In other words, the power rail pads 309, 310 are not integrated nodes of the circuitry within the semiconductor die 301.

Figure 5:
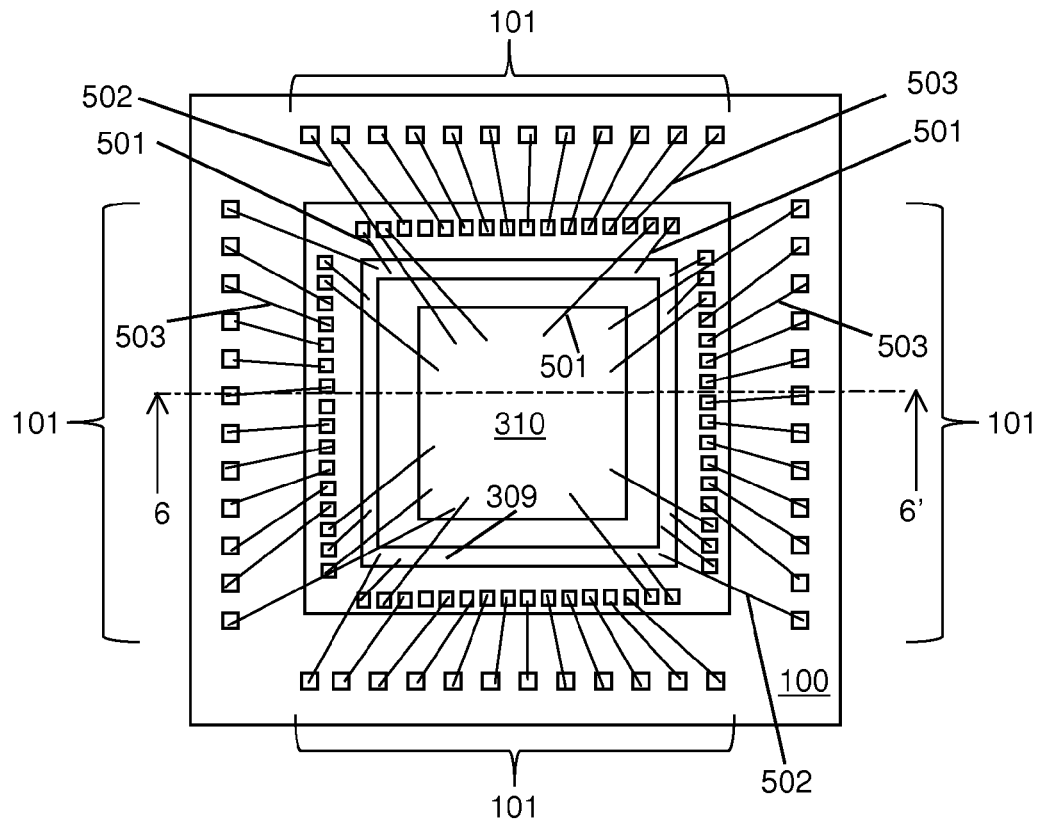
FIG. 5 is a plan view of a wire bonded, partially assembled semiconductor die package including the partially assembled semiconductor die package of FIG. 3 in accordance with a preferred embodiment of the present invention.

Referring to FIG. 5 there is illustrated a plan view of a wire bonded partially assembled semiconductor die package 500 comprising the partially assembled semiconductor die package 300 in accordance with a preferred embodiment of the present invention. The wire bonded partially assembled semiconductor die package 500 includes die wire bonds 501 electrically coupling each of the power rail pads 309, 310 to at least two of the die connection pads 304. Furthermore, the power rail pads 309, 310 are each individually coupled by the die wire bonds 501 to two or more of the die connection pads 304. More specifically, the die wire bonds 501 also electrically couple the first power rail pad 309 to the positive voltage supply rail die connection pads 307. In one embodiment the die wire bonds 501 electrically couple the first power rail pad 309 to all of the positive voltage supply rail die connection pads 307. There are also power rail wire bonds 502 that directly electrically couple the first power rail pad 309 to one or more of the external connectors 101.

The die wire bonds 501 also electrically couple the second power rail pad 310 to the ground supply rail die connection pads 308. In one embodiment the die wire bonds 501 electrically couple the second power rail 310 to all the ground supply rail die connection pads 308. In addition, the power rail wire bonds 502 directly electrically couple the second power rail pad 310 to one or more of the external connectors 101.

As shown, the data input and output pads 306 are electrically connected by data wire bonds 503 to the external connectors 101. As will be apparent to a person skilled in the art, since the power rail wire bonds 502 can supply current to many die connection pads 304, via the power rail pads 309, 310, their diameter is typically at least twice the diameter of the die wire bonds 501 and data wire bonds 503 or multiple wires of same size connected to the power rail pads 309, 310 and external connectors 101. For instance, in this embodiment the die wire bonds 501 and data wire bonds 503 have a diameter of 25 microns, whereas the power rail wire bonds 502 have a diameter of 50 microns.

Figure 6:
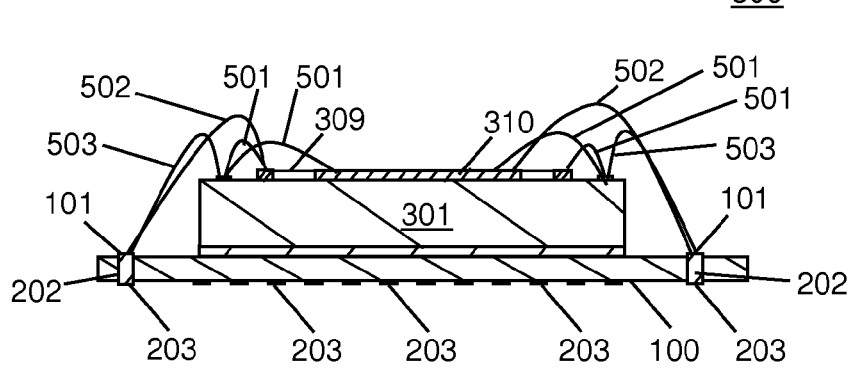
FIG. 6 is a cross-sectional view through 6-6' of the wire bonded, partially assembled semiconductor die package of FIG. 5.

FIG. 6 is a cross sectional view of the wire bonded partially assembled semiconductor die package 500. For simplification, not all the wire bonds, 501, 503, 503 are shown and in this embodiment the power rail wire bonds 501 have a higher profile and greater span than the die wire bonds 501 and data wire bonds 503.

Figure 7:
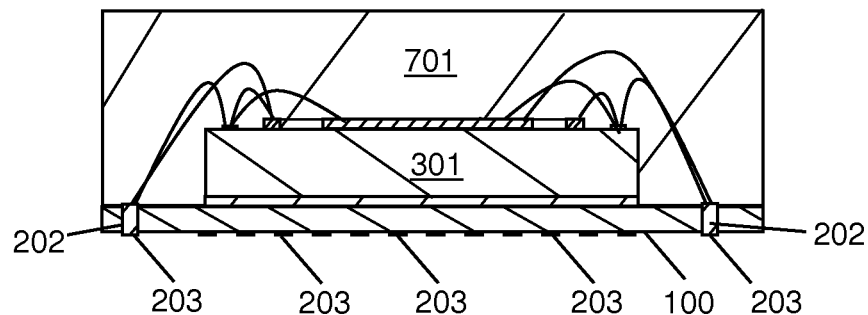
FIG. 7 is a side view of a semiconductor die package formed from the partially assembled semiconductor die package of FIG. 5 in accordance with a preferred embodiment of the present invention.

FIG. 7 is side view of a semiconductor die package 700 formed from the partially assembled semiconductor die package 500 in accordance with a preferred embodiment of the present invention. The semiconductor die package 700 is the wire bonded partially assembled semiconductor die package 500 with an encapsulating material 701 covering the semiconductor die 301, wire bonds 501, 502, 503 and the external connectors. The encapsulating material 701 in this embodiment is a molded plastics material and provides mechanical protection to the semiconductor die 301 and wire bonds 501, 502, 503 and also provides a seal against moisture and dust.

Figure 8:
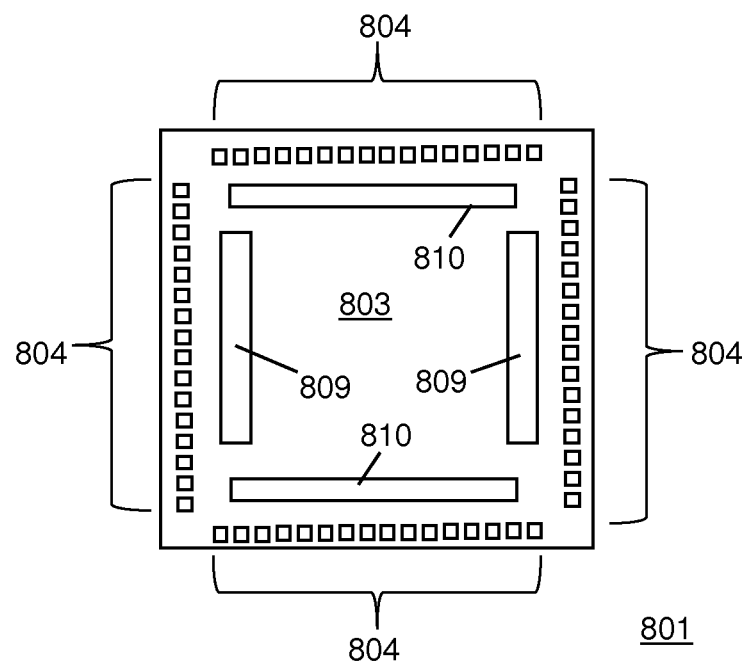
FIG. 8 is a plan view of a semiconductor die that can be used as part of the semiconductor die package of FIG. 7 in accordance with a preferred embodiment of the present invention.

Referring to FIG. 8, a plan view of a semiconductor die 801 that can be used as part of the semiconductor die package 700 in accordance with a preferred embodiment of the present invention is shown. The semiconductor die 801 has a die connection pad surface 803 with associated die connection pads 804. The die connection pads 804 are circuit nodes of the semiconductor die 801 and as shown the die connection pads 804 are typically adjacent respective edges of the semiconductor die 801. The semiconductor die 801 is essentially identical to the semiconductor die 301 with the exception of there being there are two power rail pads 809 and two power rail pads 810. These power rail pads 809, 810 are all rectangular and are formed by thin sheets of metal (or metal alloy) cut to shape and size and mounted on the die connection pad surface 803 by an epoxy or other form of adhesive.

From the above, it will be apparent to a person skilled in the art that the power rail pads 809, 810 can be of numerous shapes and it may also be possible just to have a single power rail pad on the die connection pad surface 803. Such a single power rail pad, would be used for either wire bonding to the positive voltage supply die connection pads or alternatively for the ground supply die connection pads.

Figure 9:
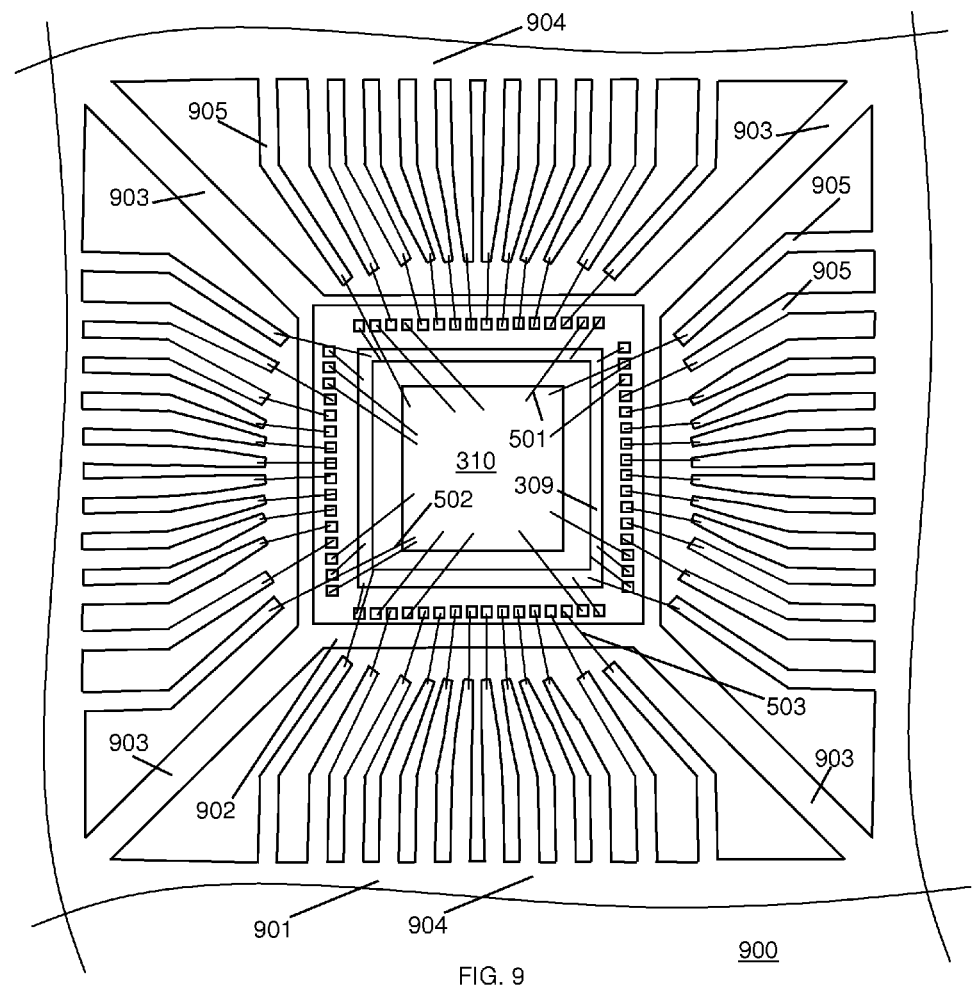
FIG. 9 is a plan view of a partially assembled semiconductor die package in accordance with another preferred embodiment of the present invention.

Referring to FIG. 9, there is illustrated a plan view of a partially assembled semiconductor die package 900 in accordance with another preferred embodiment of the present invention. The partially assembled semiconductor die package 900 includes a semiconductor die support in the form of a lead-frame 901. The lead-frame 901 includes a lead-frame flag 902 with tie bars 903 coupling the lead-frame flag 902 to an outer boundary 904 of the lead-frame 901. More specifically, the lead-frame flag 902 is typically substantially rectangular and the tie bars 903 extend from corner areas of the lead-frame flag 902. Also, the lead-frame 901 has leads 905 extending from the outer boundary 904 towards the lead-frame flag 902.

The semiconductor die 301, as described above, is mounted to the lead-frame flag 902 by an adhesive. Since the semiconductor die 301 has already been described above and to avoid repetition it is not be described again in this section. The die wire bonds 501 electrically couple each of the power rail pads 309, 310 to at least two of the die connection pads 304. Furthermore, the power rail pads 309, 310 are each individually coupled by the die wire bonds 501 to two or more of the die connection pads 304.

The die wire bonds 501 also electrically couple the first power rail pad 309 to the positive voltage supply rail die connection pads 307. In one embodiment the die wire bonds 501 electrically couple the first power rail pad 309 to all of the positive voltage supply rail die connection pads 307. As shown, the power rail wire bonds 502 directly electrically couple the first power rail pad 309 to free ends of one or more of the leads 905. Also, the die wire bonds 501 electrically couple the second power rail pad 310 to the ground supply rail die connection pads 308.

In one embodiment the die wire bonds 501 electrically couple the second power rail 310 to all the ground supply rail die connection pads 308. Again, as shown, the power rail wire bonds 502 directly electrically couple the second power rail pad 310 to free ends of one or more of the leads 905. The data wire bonds 503 and the data input and output pads 306 are electrically connected by data wire bonds 503 to the free ends of one or more of the leads 905.

Figure 10:
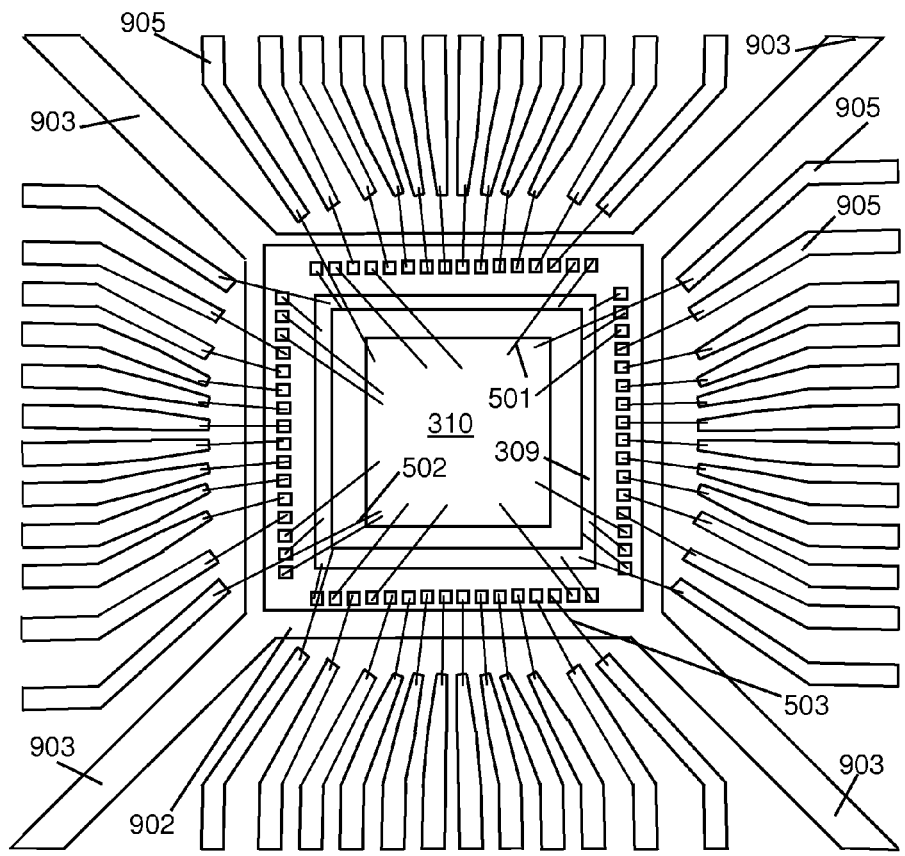
FIG. 10 is a plan view of a singulated, partially assembled semiconductor die package in accordance with a preferred embodiment of the present invention.

Referring to FIG. 10, there is illustrated a plan view of a singulated partially assembled semiconductor die package 1000 in accordance with a preferred embodiment of the present invention. The singulated partially assembled semiconductor die package 1000 includes the lead-frame 901 that has been singulated (cut away) from a surrounding integral metal sheet (typically copper) that provides the outer boundary 904. Hence, the outer boundary 904 is now an outer boundary of the singulated partially assembled semiconductor die package 1000 which is simply the outermost ends of the leads 905 which are electrically separated from each other.

Figure 11:
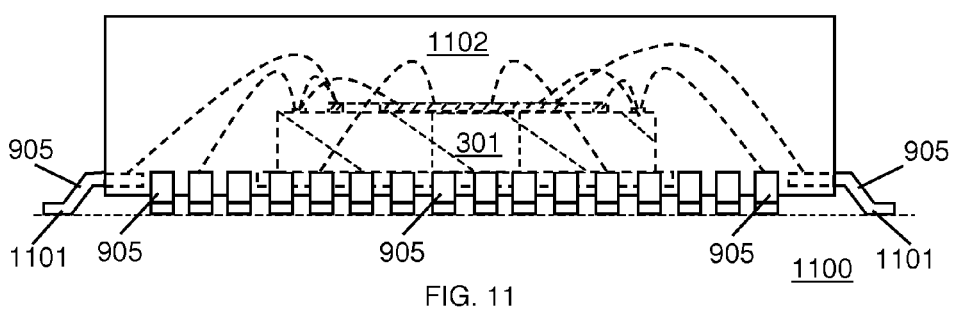
FIG. 11 is a side view of a semiconductor die package formed from the partially assembled semiconductor die packages of FIG. 10 in accordance with a preferred embodiment of the present invention.

Referring to FIG. 11, there is illustrated a side view of a semiconductor die package 1100 formed from the partially assembled semiconductor die package 1000 in accordance with a preferred embodiment of the present invention. For simplification, not all the wire bonds, 501, 503, 503 are not included in the illustration. As shown, the outermost ends of the leads 905 are bent to provide contact pads (feet) 1101 that form a seating plane. There is an encapsulating material 1102 covering the semiconductor die 301 and wire bonds 501, 502, 503 and the encapsulating material 1102 provides mechanical protection and a seal against moisture and dust.

Figure 12:
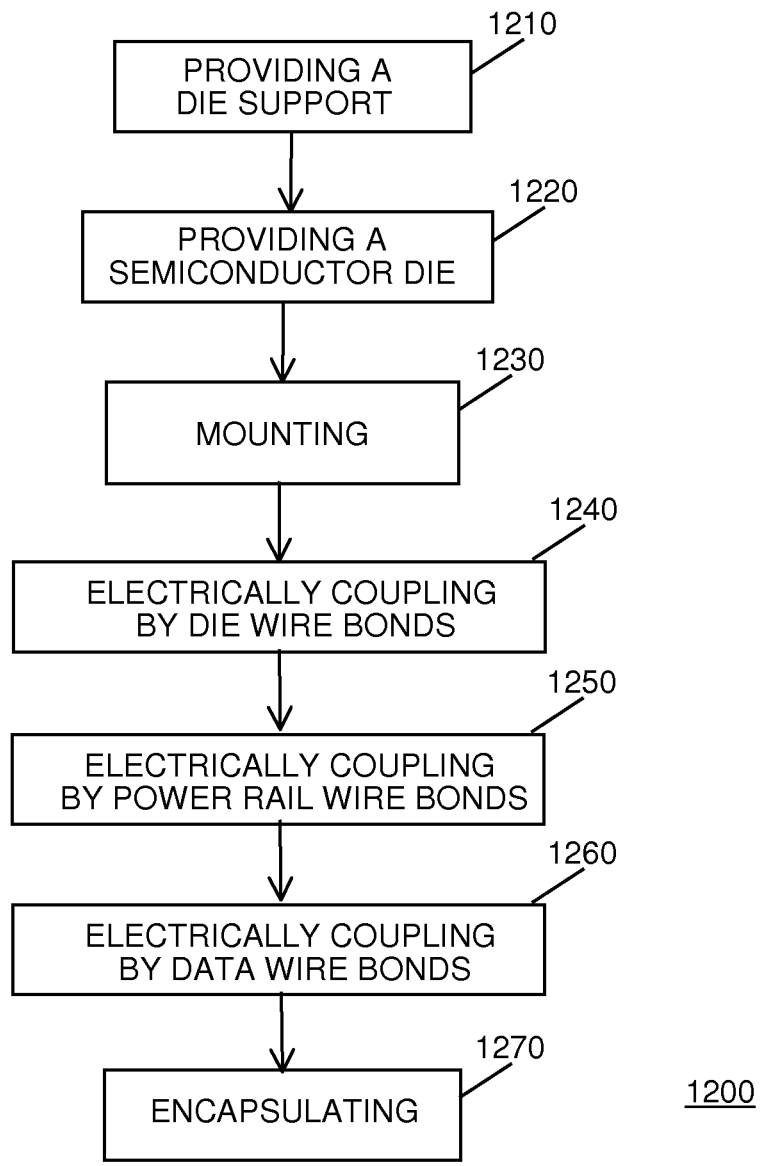
FIG. 12 is a flow chart of a method for assembling a semiconductor die package in accordance with a preferred embodiment of the present invention.

Referring to FIG. 12, there is illustrated a flow chart of a method 1200 for assembling a semiconductor die package in accordance with a preferred embodiment of the present invention. By way of example, the method 1200 will be described with reference to the semiconductor die package 700. The method 1200, at a providing block 1210, provides the semiconductor die support 100 with the external connectors 101 and at a providing block 1220 the semiconductor die 301 is provided. As shown, the first power rail pad 309 and a second power rail pad 310 have surface areas larger than the surface areas of the die connection pads 304. As previously mentioned, the semiconductor die 301 includes the die support mounting surface 302 and the opposite die connection pad surface 303 has associated die connection pads 304 and power rail pads 309, 310 having a surface area of at least four times that of an average surface area of the die connection pads 304.

The method 1200, at a mounting block 1230, performs mounting the semiconductor die 301 to the die support at the die support mounting surface 302. At an electrically coupling block 1240 there is performed electrically coupling of the power rail pads 309, 310 to at least two of the die connection pads 304 by die wire bonds 501. Also, at an electrically coupling block 1250 there is performed a process of electrically coupling the power rail pads 309, 310 to at least one of the external connectors 101 by the power rail wire bonds 502. Further, at an electrically coupling block 1260 there is performed a process of electrically coupling some of the die connection pads 304 to the external connectors 101 by the data wire bonds 503. The method 1200, at an encapsulating block 1270, then performs a process of encapsulating the semiconductor die 310, power rail wire bonds 502, die wire bonds 501 and data wire bonds 503.

Advantageously, the present invention provides for the reduction of power rail wire bonds 502 by the use of the first and second power rail pads 309, 310. More specifically, the wire bond connections from the die connection pads to the power rail pads 309, 310 reduce the number of connections to the substrate or lead-frame and therefore potentially shorten the data wire bond connection lengths therebetween. Accordingly, the footprint, number of external connectors, potential stray capacitances and the possibility of noise induction can be reduced or at least alleviated.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. For instance, although the external connectors are shown as aligned in single rows, they can be aligned in multi rows or in any form or desirable array or configuration. It is understood, therefore, that this invention is not limited to the particular embodiment disclosed, but covers modifications within the spirit and scope of the present invention as defined by the appended claims.

The invention claimed is:

1. A semiconductor die package, comprising:
   a semiconductor die support having external connectors;
   a semiconductor die mounted to the die support, the semiconductor die having a die support mounting surface attached to the die support and an opposite die connection pad surface with associated die connection pads, wherein the connection die pads are circuit nodes of the semiconductor die;
   at least one power rail pad on the die connection pad surface, the power rail pad having a larger surface area than surface areas of the die connection pads; and
   die wire bonds electrically coupling the power rail pad to at least two of the die connection pads.

2. The semiconductor die package of claim 1, wherein the at least one power rail pad includes a first power rail pad and a second power rail pad each individually coupled by the die wire bonds to at least two of the die connection pads.

3. The semiconductor die package of claim 2, wherein the die connection pads include positive voltage supply rail die connection pads, and wherein the die wire bonds electrically couple the first power rail pad to at least two of the positive voltage supply rail die connection pads.

4. The semiconductor die package of claim 3, wherein power rail wire bonds directly electrically couple the first power rail pad to at least one of the external connectors.

5. The semiconductor die package of claim 4, wherein the die connection pads include ground supply rail die connection pads and wherein the die wire bonds electrically couple the second power rail pad to at least two of the ground supply rail die connection pads.

6. The semiconductor die package of claim 5, wherein power rail wire bonds electrically couple the second power rail pad to at least one of the external connectors.

7. The semiconductor die package of claim 4, wherein the die connection pads include ground supply rail die connection pads and wherein the die wire bonds electrically couple the second power rail pad to at least two of the ground supply rail die connection pads, and wherein the power rail wire bonds electrically couple the second power rail pad to at least one of the external connectors.

8. The semiconductor die package of claim 7, wherein the die connection pads are adjacent respective edges of the semiconductor die and include data input and output pads for the semiconductor die, the data input and output pads being electrically connected by data wire bonds to the external connectors.

9. The semiconductor die package of claim 8, wherein the power rail wire bonds are least twice the diameter of data wire bonds.

10. The semiconductor die package of claim 2, wherein the first power rail pad is a frame that encloses the second power rail pad.

11. The semiconductor die package of claim 1, wherein the die connection pads are integral with the semiconductor die and wherein the power rail pad is a non-circuit node of the semiconductor die.

12. The semiconductor die package of claim 1, wherein the semiconductor die support is a non-conductive substrate.

13. The semiconductor die package of claim 1, wherein the semiconductor die support is a lead frame.

14. The semiconductor die package of claim 1, further including an encapsulating material covering the semiconductor die and die wire bonds.

15. A semiconductor die, comprising:
   a die support mounting surface and an opposite die connection pad surface with associated die connection pads, wherein the die connection pads are circuit nodes of the semiconductor die; and
   at least one power rail pad on the die connection pad surface, the power rail pad having a surface area larger than surface areas of the die connection pads,
   wherein the die connection pads are integral with the semiconductor die and wherein the power rail pad is a non-circuit node of the semiconductor die.

16. The semiconductor die of claim 15, wherein the least one power rail pad includes a first power rail pad and a second power rail pad, wherein the first power rail pad is a frame that encloses the second power rail pad.

17. The semiconductor die of claim 15, further comprising die wire bonds electrically coupling the power rail pad to at least two of the die connection pads.

18. The semiconductor die of claim 17, wherein the least one power rail pad includes a first power rail pad and a second power rail pad, each individually coupled by the die wire bonds to at least two of the die connection pads.

19. A method for assembling a semiconductor die package, the method including:
   providing a semiconductor die support with external connectors;
   providing a semiconductor die with a die support mounting surface and an opposite die connection pad surface with associated die connection pads, the connection pads being circuit nodes of the semiconductor die, wherein there is at least one power rail pad on the die connection pad surface, the power rail pad having a surface area larger than surface areas of the die connection pads;
   mounting the semiconductor die to the die support at the die support mounting surface;
   electrically coupling the power rail pad to at least two of the die connection pads by die wire bonds;
   electrically coupling the power rail pad to at least one of the external connectors by power rail wire bonds;
   electrically coupling some of the die connection pads to the external connectors by data wire bonds; and
   encapsulating the semiconductor die, power rail wire bonds, die wire bonds and data wire bonds.

20. The method for assembling a semiconductor die package of claim 19, wherein the die connection pads are integral with the semiconductor die, and wherein the power rail pad is a non-circuit node of the semiconductor die.

\* \* \* \* \*